(12) United States Patent
Peters et al.

(10) Patent No.: US 9,291,910 B2
(45) Date of Patent: Mar. 22, 2016

(54) AQUEOUS SOLUTION AND PROCESS FOR REMOVING SUBSTANCES FROM SUBSTRATES

(71) Applicant: Dynaloy, LLC, Kingsport, TN (US)

(72) Inventors: Richard Dalton Peters, Westfield, IN (US); Travis W. Acra, Ingalls, IN (US); Yuanmei Cao, Indianapolis, IN (US); Nichelle Maria Gilbert, Fishers, IN (US); Michael Tod Phenis, Markleville, IN (US); Kimberly Dona Pollard, Anderson, IN (US); Joshua Cummins, Indianapolis, IN (US); Meng Guo, Indianapolis, IN (US); Donald James Pfettscher, Brownsburg, IN (US)

(73) Assignee: Dynaloy, LLC, Kingsport, TN (US)

( * ) Notice: Subject to any disclaimer, the term of this patent is extended or adjusted under 35 U.S.C. 154(b) by 158 days.

(21) Appl. No.: 14/038,877

(22) Filed: Sep. 27, 2013

(65) Prior Publication Data

US 2015/0094249 A1    Apr. 2, 2015

(51) Int. Cl.
*G03F 7/42*     (2006.01)
*C11D 11/00*    (2006.01)

(52) U.S. Cl.
CPC ............... *G03F 7/425* (2013.01); *G03F 7/423* (2013.01); *C11D 11/0047* (2013.01)

(58) Field of Classification Search
CPC . C11D 11/0047; C11D 7/3209; C11D 3/0073
See application file for complete search history.

(56) References Cited

U.S. PATENT DOCUMENTS

| 5,489,557 A | 2/1996 | Jolley |
| 8,183,162 B2 | 5/2012 | Chang |
| 2002/0077259 A1* | 6/2002 | Skee .............................. 510/175 |
| 2008/0261847 A1* | 10/2008 | Visintin et al. ................ 510/176 |
| 2009/0082240 A1 | 3/2009 | Nukui et al. |
| 2009/0215658 A1* | 8/2009 | Minsek et al. ................ 510/175 |
| 2009/0241988 A1 | 10/2009 | Ramachandrarao et al. |
| 2012/0295447 A1* | 11/2012 | Tamboli et al. ............... 438/753 |
| 2013/0200040 A1 | 8/2013 | Fitzsimmons et al. |

(Continued)

FOREIGN PATENT DOCUMENTS

| EP | 1 211 563 A1 | 6/2002 |
| JP | 2008166404 A | 7/2008 |
| JP | 2011208227 A | 10/2011 |

(Continued)

OTHER PUBLICATIONS

Notification of Transmittal of the International Search Report and the Written Opinion of the International Searching Authority with Date of Mailing Feb. 3, 2015 for International Application No. PCT/US2014/055191.

*Primary Examiner* — Gregory Webb
(74) *Attorney, Agent, or Firm* — Matthew W. Smith; Dennis V. Carmen (57) ABSTRACT

The disclosure is directed solutions and processes to remove substances from substrates. In some cases, the substances can include photoresist on semiconductor wafers. The solution can include hydrogen peroxide in an amount that is no greater than 15% by weight of the total weight of the solution. The solution can also include a quaternary ammonium hydroxide and water. Further, the solution can include an amine, a co-solvent, or both. One or more sides of the substrate can be contacted with the solution to remove one or more substances from the solution.

28 Claims, 1 Drawing Sheet

(56) References Cited

U.S. PATENT DOCUMENTS

2013/0270217 A1* 10/2013 Yoshida et al. ............... 216/13
2015/0027978 A1* 1/2015 Barnes et al. ................. 216/13

FOREIGN PATENT DOCUMENTS

| WO | WO 02/33033 A1 | 4/2002 |
| WO | WO 2005/085957 A1 | 9/2005 |

* cited by examiner

100

```
┌─────────────────────────────────────────────────────────────┐
│ PROVIDE A SUBSTRATE INCLUDING A FIRST SIDE AND A SECOND SIDE │
│    SUBSTANTIALLY PARALLEL TO THE FIRST SIDE, WHEREIN A      │
│   SUBSTANCE IS DISPOSED ON AT LEAST A PORTION OF THE FIRST  │
│  SIDE OF THE SUBSTRATE, AT LEAST A PORTION OF THE SECOND SIDE│
│                OF THE SUBSTRATE, OR BOTH                     │
│                           102                                │
└─────────────────────────────────────────────────────────────┘
                              │
                              ▼
┌─────────────────────────────────────────────────────────────┐
│   PROVIDE A SOLUTION THAT INCLUDES A QUATERNARY AMMONIUM    │
│  HYDROXIDE AND WATER TO REMOVE AT LEAST A PORTION OF THE    │
│             SUBSTANCE FROM THE SUBSTRATE                     │
│                           104                                │
└─────────────────────────────────────────────────────────────┘
                              │
                              ▼
┌─────────────────────────────────────────────────────────────┐
│   CONTACT THE SUBSTRATE WITH THE SOLUTION TO REMOVE AT      │
│   LEAST A PORTION OF THE SUBSTANCE FROM THE SUBSTRATE       │
│                           106                                │
└─────────────────────────────────────────────────────────────┘
```

AQUEOUS SOLUTION AND PROCESS FOR REMOVING SUBSTANCES FROM SUBSTRATES

BACKGROUND

Various substances, such as polymers, may be used in the manufacture of electronic devices, such as computer chips, memory devices, light emitting diodes (LEDs), and the like. In some cases, these substances may be used to form features on surfaces of substrates (e.g., semiconductor device substrates) included in electronic devices. In processing the substrates, these substances may be removed from the surfaces of the substrates. In one example, a layer of a substance may be disposed on at least a portion of the surface of a substrate and at least a portion of the layer may be removed during subsequent processing of the substrates. In another example, the substance may be a residue produced when a particular process is performed on the substrate. In any case, the effectiveness of the removal of the substances from the substrates can affect the quality of the operation of the semiconductor devices.

In an illustrative situation, photoresists and organic-based dielectrics may be used in the manufacture of semiconductor devices included in electronic devices. Photoresists, for example, may be used throughout semiconductor device fabrication in photolithographic operations. A photoresist may be exposed to actinic radiation through a photomask. For example, a polymeric photoresist can be applied to a substrate as a mask to define the placement of solder onto the substrate. After solder is deposited onto the substrate, the photoresist must be removed before the next step in the process can occur. In another example, a polymeric photoresist can be applied to a substrate as an etch mask used to define structures on the substrate that are created in an etch process. After the etch process, there is typically a polymeric residue remaining on the substrate that must be removed before the next step in the process can occur.

In some cases, a positive photoresist may be used. Exposure of the positive photoresist to actinic radiation may cause a chemical reaction resulting in a solubility increase in aqueous alkali that allows the positive photoresist to be dissolved and rinsed away with developer. In other cases, a negative photoresist may be used. When the negative photoresist is exposed to actinic radiation, cross-linking of the polymer may occur in the exposed regions while leaving unexposed regions unchanged. The unexposed regions may be subject to dissolution and rinsing by a suitable developer chemistry. Following development, a resist mask may be left behind. The design and geometry of the resist mask may depend upon the positive or negative tone of the resist. Positive tone resist may match the design of the photomask, while a negative tone resist may provide a pattern that is opposite the photomask design.

Photoresists are used extensively in the packaging of microelectronic devices. In wafer level packaging, solder is applied directly to wafers that have completed the fabrication of the microelectronic devices but have not been diced into individual chips. A photoresist is used as the mask to define the placement of the solder on the wafers. After solder is deposited onto the wafer, the photoresist must be removed before the next step in the packaging process can occur. Typically in wafer level packaging, the photoresist can have a thickness greater than about 10 micrometers and sometimes as thick as about 120 micrometers. The photoresist can be positive or negative, and can be applied either as a liquid or a dry film. In wafer level packaging, the use of thick dry film negative photoresist is common.

Due to the thickness and cross-linked nature of thick dry film negative photoresist, the removal of this material after solder deposition can be difficult. In some cases, the photoresist can be deposited onto a dielectric material where the adhesion between the photoresist and the dielectric is strong enough to make removal of the photoresist difficult.

SUMMARY

The disclosure is directed solutions and processes to remove substances from substrates. The substances can include photoresist on semiconductor wafers. In particular, the photoresist can include a dry film acrylate-based photoresist that is on a semiconductor wafer that includes one or more solder bumps. The solder bumps can be formed from a Sn-based solder. Additionally, the substrate can include exposed dielectric material in addition to exposed Cu.

The solution can include hydrogen peroxide in an amount that is no greater than 15% by weight of the total weight of the solution. The solution can also include a quaternary ammonium hydroxide and water. Further, the solution can include an amine, a co-solvent, or both. The solution can also be free of hydrogen peroxide and include a quaternary ammonium hydroxide, an amine, a co-solvent, and water.

The solution can include the quaternary ammonium hydroxide in an amount no greater than about 12% by weight of the total weight of the solution. Additionally, the solution can include the amine in an amount no greater than about 12% by weight of the total weight of the solution and the co-solvent in an amount no greater than about 12% by weight of the total weight of the solution. The amine can include a tertiary amine. The co-solvent can also include an organic polar aprotic solvent. Furthermore, the co-solvent can include a ketone. The solution can include a corrosion inhibitor, an anti-foaming additive, or both.

One or more sides of the substrate can be contacted with the solution to remove one or more substances from the substrate. For example, one or more sides of the substrate can be contacted with the solution to remove photoresist from the one or more sides of the substrate. The substrate can be contacted with the solution at temperature of at least about 60° C. for a duration of at least about 30 minutes. If desired, fresh amounts of the solution can be provided to contact the substrate at one or more intervals during the process. In an example, a fresh amount of the solution can be applied to the substrate at an interval of about 10 minutes or about 15 minutes for the duration of the process.

DETAILED DESCRIPTION

This disclosure describes aqueous solutions and processes to remove substances from substrates. When the substance is in contact with the solution, the substance may be released from a surface of the substrate. One or more sides of the substrate can be contacted by the solution. If desired, one or more substrates can be immersed in the solution. In other situations, the solution can be dispensed onto at least one surface of one or more substrates to remove at least one substance from the substrate. For example, the solution can be sprayed onto one or more surfaces of the substrate to remove at least one substance from the one or more surfaces of the substrate.

Processes described herein may be utilized to remove substances from substrates, such as microelectronic wafers, flat panel displays, LEDs, and so forth. The techniques described herein can be used to remove photoresist from electronic device substrates. The photoresist may be removed in conjunction with wafer level packaging operations. Furthermore, by using solutions and processes described herein, the efficient removal of targeted substances from substrates can be accomplished with minimal impact to other substances on the substrates. For example, in the removal of photoresist from a substrate, any corrosion of copper or solder included on the substrate can be minimized or eliminated.

The term "coating" is defined as a method for applying a film to a substrate such as spray coating, puddle coating, or slit coating. The term "release" or "releasing" relates to removal of the substance form the substrate and is defined to include dissolution of the substance. The indefinite articles "a" and "an" are intended to include both the singular and the plural. All ranges are inclusive and combinable in any order except where it is clear that such numerical ranges are constrained to add up to 100%, and each range includes all the integers within the range. The terms "weight percent" or "wt %" mean weight percent based on the total weight of the composition, unless otherwise indicated.

Figure 1:
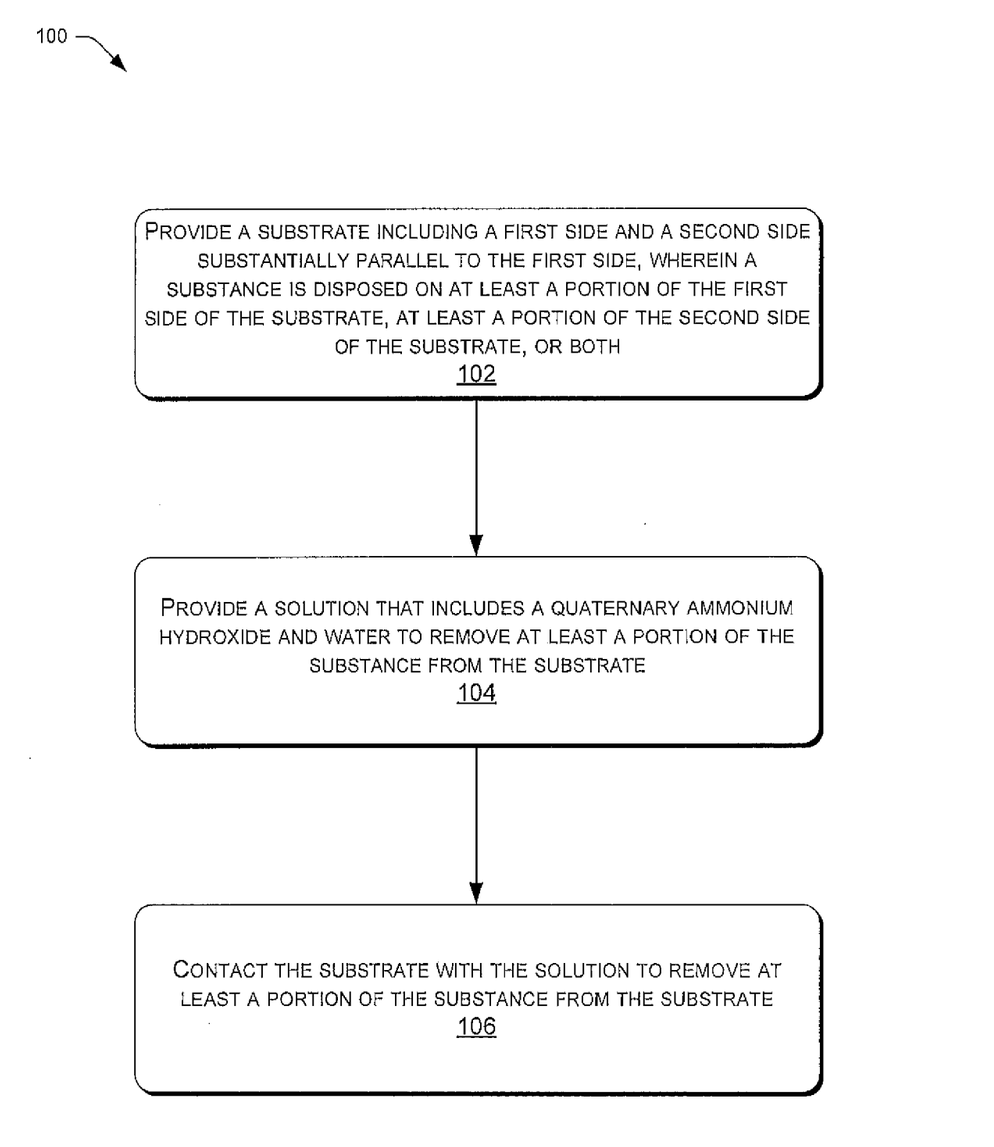
FIG. 1 is a flow diagram of a process to remove substances from substrates.

FIG. 1 is a flow diagram of an example process 100 to remove substances from substrates. At 102, the process 100 includes providing a substrate including a first side and a second side substantially parallel to the first side. The substrate may include an inorganic substrate, such as a silicon-containing substrate. For example, the substrate can include silicon or silicon dioxide. The silicon-containing substrate can be doped with one or more materials, such as B, Ga, As, P, or combinations thereof. The substrate can also include one or more metals. Additionally, the substrate can include organic materials, such as one or more polymeric materials. For example, the substrate can include a polyimide. Further, the substrate can include one or more layers, such as one or more core layers, one or more reinforcing layers, one or more insulating layers, one or more metal layers, or a combination thereof. In addition, features of circuit patterns, bonding articles (e.g. solder balls), combinations thereof, and the like, can be disposed on one or more sides of the substrate.

Surfaces of the substrate can be circular in shape. Alternatively, surfaces of the substrate can be planar in shape, such as rectangular or square-shaped. Additionally, the substrate can have one or more dimensions defining a surface area of the substrate, such as radius, diameter, length, width, or combinations thereof. The substrate can also have a thickness. The thickness of the substrate can include the thickness of one or more layers of the substrate. The thickness of the substrate can be in a range of about 250 micrometers to about 950 micrometers, in a range of about 500 micrometers to about 800 micrometers, or in a range of about 700 micrometers to about 780 micrometers. Additionally, the width or the diameter of the substrate can be in a range of about 50 mm to about 450 mm, in a range of about 200 mm to about 300 mm, or in a range of about 200 mm to about 450 mm.

The substrate may be thinner. For example, substrates can be thinned to enable stacking of devices into one single package. The thickness of thin substrates can be in a range of 20 micrometers to 100 micrometers, or in a range from 25 micrometers to 75 micrometers. The thin substrate can be supported on a carrier and attached to the carrier by an adhesive. The carrier and the adhesive are temporary supports from which the thin substrate can be removed. During processing of the thin substrate while attached to the carrier, the thickness of the carrier and thin substrate combination can be included in a range of about 700 mm to about 900 mm.

A substance can be disposed on the substrate. The substance can be disposed on one side of the substrate. For example, the substance can be disposed as a layer covering substantially all of a particular side of the substrate. In another example, the substance can be disposed on portions of the particular side of the substrate, while other portions of the particular side of the substrate are free from the substance. The substance can be disposed on the particular side of the substrate according to a pattern. Additionally, the substance can be disposed on multiple sides of the substrate.

Furthermore, the thickness of the substance disposed on the substrate can be substantially uniform. Alternatively, the thickness of the substance disposed on the substrate varies. The thickness of the substance disposed on the substrate may be no greater than about 200 micrometers, no greater than about 150 micrometers, or no greater than about 100 micrometers. In addition, the thickness of the substance on the substrate can be at least about 5 micrometers, at least about 25 micrometers, at least about 40 micrometers, or at least about 60 micrometers. In an illustrative example, the thickness of the substance on the substrate may be included in a range of about 8 micrometers to about 125 micrometers. In another illustrative example, the thickness of the substance on the substrate may be included in a range of about 20 micrometers to about 80 micrometers.

Photoresist may be disposed on a side of the substrate. The photoresist can be a negative photoresist. Alternatively, the photoresist may be a positive photoresist. The photoresist disposed on a side of the substrate may have been exposed to actinic radiation, such as ultraviolet light. Additionally, the photoresist may have been subjected to one or more additional processes before the solution is applied to the one or more surfaces of the substrate. The photoresist can include an acrylate polymer. For example, the photoresist can be a thick dry film acrylate-based photoresist.

At 104, the process 100 includes providing a solution to remove one or more substances from the substrate. The solution can dissolve a targeted substance (e.g., photoresist) that is disposed on the substrate and/or cause the targeted substance to be released from the substrate.

The substrate can be immersed in the solution. For example, the substrate can be immersed in a bath of the solution. The solution can also be applied to one or more sides of the substrate. For example, one or more sides of the substrate can be coated with the solution. To illustrate, one or more sides of the substrate can be sprayed with the solution. Additionally, the solution can be spin coated onto one or more sides of the substrate. When multiple sides of the substrate are contacted with the solution, the solution can be applied to each side in a sequential manner. That is, the solution can be applied to a side of the substrate for a specified period of time and under suitable conditions, and then the solution can be applied to an additional side of the substrate. Alternatively, the solution can be applied to multiple sides of the substrate substantially contemporaneously.

The solution can be an aqueous solution that includes hydrogen peroxide. The hydrogen peroxide can be added to a precursor solution before being applied to the substrate. In addition, the solution can include a concentrated version that includes less than 50% by weight water for a total weight of the solution and is substantially free of hydrogen peroxide. Water and hydrogen peroxide can then be added to the concentrated solution at the point of use before contacting the substrate with the solution. The concentrated solution can be added to an existing volume of solution that is contacting the substrate. For example, one or more substrates including one or more substances to be removed can be immersed in a bath of an initial volume of solution. As time progresses, additional volumes of the solution and/or volumes of a concentrated version of the solution can be added to the bath to remove the one or more substances from the one or more substrates.

The solution can include a quaternary ammonium hydroxide. For example, the solution can include tetraethylammonium hydroxide (TEAH). In another example, the solution can include tetramethylammonium hydroxide (TMAH). In other examples, the solution can include dimethyldipropylammonium hydroxide, tetrapropylammonium hydroxide, benzyltrimethylammonium hydroxide, dimethyldiethyl ammonium hydroxide and/or tetrabutylammonium hydroxide. In additional examples, the solution can include TEAH, TMAH, dimethyldipropylammonium hydroxide, tetrapropylammonium hydroxide, tetrabutylammonium hydroxide, or a combination thereof.

The solution can include no greater than about 15% by weight of the quaternary ammonium hydroxide for a total weight of the solution, no greater than about 12% by weight of the quaternary ammonium hydroxide for a total weight of the solution, or no greater than about 9% by weight of the quaternary ammonium hydroxide for a total weight of the solution. In addition, the solution can include at least about 0.3% by weight of the quaternary ammonium hydroxide, at least about 2% by weight of the quaternary ammonium hydroxide for a total weight of the solution, at least about 4% by weight of the quaternary ammonium hydroxide for a total weight of the solution, or at least about 6% by weight of the quaternary ammonium hydroxide for a total weight of the solution. Further, the solution can include an amount of the quaternary ammonium hydroxide included in a range of about 0.5% by weight to about 10% by weight for a total weight of the solution. If desired, the solution can include an amount of the quaternary ammonium hydroxide included in a range of about 2% by weight to about 5% by weight of the total weight of the solution.

When the solution is a concentrated version of the solution that does not include added water and/or hydrogen peroxide, the solution can include no greater than about 35% by weight of the quaternary ammonium hydroxide for a total weight of the solution, no greater than about 30% by weight of the quaternary ammonium hydroxide for a total weight of the solution, no greater than about 25% by weight of the quaternary ammonium hydroxide for a total weight of the solution, or no greater than about 20% by weight of the quaternary ammonium hydroxide for a total weigh of the solution. In addition, when the solution is a concentrated version of the solution that does not include added water or hydrogen peroxide, the solution can include at least about 1% by weight quaternary ammonium hydroxide for a total weight of the solution, at least about 5% by weight quaternary ammonium hydroxide for a total weight of the solution, at least about 10% by weight quaternary ammonium hydroxide for a total weight of the solution, or at least about 15% by weight quaternary ammonium hydroxide for a total weight of the solution. In an example, the concentrated version of the solution can include an amount of quaternary ammonium hydroxide included in a range of about 1% by weight to about 30% by weight of a total weight of the solution. In another example, the concentrated version of the solution can include an amount of quaternary ammonium hydroxide included in a range of about 15% by weight to about 22% by weight of a total weight of the solution.

The solution can also include an amine. For example, the amine can include a tertiary amine. Additionally, the amine can include a heterocyclic tertiary amine. In particular, the amine can include 1,8-diazabicyclo[5.4.0]undec-7-ene. Additionally, the amine can include pyridine, 1,5-diazabicyclo[4.3.0]non-5-ene, 1,4-diazbicyclo[2.2.2]octane, hexamethylenetetramine, pyridazine, pyrimidine, phthalazine, pyrazine, or quinolone. Further, the amine can include 1,8-diazabicyclo[5.4.0]undec-7-ene, pyridine, 1,5-diazabicyclo[4.3.0]non-5-ene, 1,4-diazbicyclo[2.2.2]octane, hexamethylenetetramine, pyridazine, pyrimidine, phthalazine, pyrazine, quinolone, or a combination thereof.

The solution can include no greater than about 12% by weight of the amine for a total weight of the solution, no greater than about 10% by weight of the amine for a total weight of the solution, and no greater than about 8% by weight of the amine for a total weight of the solution. Additionally, the solution can include at least about 0.8% by weight of the amine for a total weight of the solution, at least about 2% by weight of the amine for a total weight of the solution, or at least about 5% by weight of the amine for a total weight of the solution. The solution can also include an amount of the amine included in a range of about 1% by weight to about 10% by weight for a total weight of the solution. Furthermore, the solution can include an amount of the amine included in a range of about 2% by weight to about 6% by weight for a total weight of the solution.

When the solution is a concentrated version of the solution that does not include additional water and/or hydrogen peroxide, the solution can include no greater than about 44% by weight of the amine for a total weight of the solution, no greater than about 38% by weight of the amine for a total weight of the solution, no greater than about 30% by weight of the amine for a total weight of the solution, or no greater than about 25% by weight of the amine for a total weight of the solution. In addition, the concentrated version of the solution can include at least 1% by weight of the amine for a total weight of the solution, at least 4% by weight of the amine for a total weight of the solution, at least 12% by weight of the amine for a total weight of the solution, or at least about 20% by weight of the amine for a total weight of the solution. In an example, the concentrated version of the solution can include an amount of the amine included in a range of about 1% by weight to about 42% by weight for a total weight of the solution. In another example, the concentrated version of the solution can include an amount of the amine included in a range of about 15% by weight to about 25% by weight for a total weight of the solution.

The solution can also include a co-solvent. The co-solvent can also include an organic polar solvent. In addition, the co-solvent can include an organic polar aprotic solvent. For example, the co-solvent can include dimethyl sulfoxide (DMSO). In another example, the co-solvent can include a ketone. In additional examples, the co-solvent can include 2-pentanone (MPK). In further examples, the co-solvent can include n-methyl-2-pyrrolidone (NMP), methyl ethyl ketone (MEK), or acetone. Additionally, the co-solvent can include 2-pentanone (MPK), n-methyl-2-pyrrolidone (NMP), methyl ethyl ketone (MEK), acetone, or combinations thereof.

The solution can include no greater than about 12% by weight of a co-solvent for a total weight of the solution, no greater than about 10% by weight of a co-solvent for a total weight of the solution, or no greater than about 6% by weight of a co-solvent for a total weight of the solution. The solution can also include at least about 0.7% by weight of a co-solvent for a total weight of the solution, at least about 2% by weight of a co-solvent for a total weight of the solution, or at least about 4% by weight of a co-solvent for a total weight of the solution. In addition, the solution can include an amount of a co-solvent included in a range of about 1% by weight to about 10% by weight for a total weight of the solution. Further, the solution can include an amount of a co-solvent included in a range of about 2% by weight to about 4% by weight for a total weight of the solution.

When the solution includes a concentrated solution without additional water and/or hydrogen peroxide, the solution can include no greater than about 30% by weight of a co-solvent for a total weight of the solution, no greater than about 25% by weight of a co-solvent for a total weight of the solution, or no greater than about 20% by weight of a co-solvent for a total weight of the solution. Additionally, the concentrated version of the solution can include at least about 1% by weight of a co-solvent for a total weight of the solution, at least about 5% by weight of a co-solvent for a total weight of the solution, at least about 10% by weight of a co-solvent for a total weight of the solution, or at least about 15% by weight of a co-solvent for a total weight of the solution. In an example, a concentrated version of the solution can include an amount of a co-solvent included in a range of about 1% by weight to about 28% by weight for a total weight of the solution. In another example, a concentrated version of the solution can include an amount of a co-solvent included in a range of about 15% by weight to about 25% by weight for a total weight of the solution.

The solution can also include a corrosion inhibitor. The corrosion inhibitor can minimize or eliminate corrosion of one or more metals on the substrate, such as copper or solder. In particular, the corrosion inhibitor can include one or more of dodecanedioic acid, sebacic acid, or undecanedioic acid. In addition, the solution can include no greater than about 9% by weight of the corrosion inhibitor for a total weight of the solution, no greater than about 7% by weight of the corrosion inhibitor for a total weight of the solution, and no greater than about 5% by weight of the corrosion inhibitor for a total weight of the solution. Furthermore, the solution can include at least about 0.1% by weight of the corrosion inhibitor for a total weight of the solution, at least about 1% by weight of the corrosion inhibitor for a total weight of the solution, or at least about 3% by weight of the corrosion inhibitor for a total weight of the solution. The solution can include an amount of the corrosion inhibitor included in a range of about 0.1% by weight to about 8% by weight for a total weight of the solution. The solution can also include an amount of the corrosion inhibitor included in a range of about 0.5% by weight to about 4% by weight for a total weight of the solution.

Other suitable corrosion inhibitors include, but are not limited to, dodecanedioic acid, undecanedioic acid, silicates such as ethyl silicate and tetramethyl ammonium silicate; aromatic hydroxyl compounds such as catechol and resorcinol; alkylcatechols such as methylcatechol, ethylcatechol and t-butylcatechol, phenols and pyrogallol; aromatic triazoles such as benzotriazole; alkylbenzotriazoles; carboxylic acids such as formic acid, acetic acid, propionic acid, butyric acid, isobutyric acid, oxalic acid, malonic acid, succinic acid, glutaric acid, maleic acid, fumaric acid, benzoic acid, phtahlic acid, 1,2,3-benzenetricarboxylic acid, glycolic acid, lactic acid, malic acid, citric acid, acetic anhydride, phthalic anhydride, maleic anhydride, succinic anhydride, salicylic acid, gallic acid, and gallic acid esters such as methyl gallate and propyl gallate; organic salts of carboxyl containing organic containing compounds described above, basic substances such as ethanolamine, trimethylamine, diethylamine and pyridines, such as 2-aminopyridine, and the like, and chelate compounds such as phosphoric acid-based chelate compounds including 1,2-propanediaminetetramethylene phosphonic acid and hydroxyethane phosphonic acid, carboxylic acid-based chelate compounds such as ethylenediaminetetraacetic acid and its sodium and ammonium salts, dihydroxyethylglycine and nitrilotriacetic acid, amine-based chelate compounds such as bipyridine, tetraphenylporphyrin and phenanthroline, and oxime-based chelate compounds such as dimethylglyoxime and diphenylglyoxime.

When the solution is a concentrated version of the solution that does not include additional water and/or hydrogen peroxide, the solution can include no greater than about 28% by weight of the corrosion inhibitor for a total weight of the solution, no greater than about 21% by weight of the corrosion inhibitor for a total weight of the solution, no greater than about 18% by weight of the corrosion inhibitor for a total weight of the solution, or no greater than about 15% by weight of the corrosion inhibitor for a total weight of the solution. In addition, the concentrated version of the solution can include at least about 0.2% by weight of the corrosion inhibitor for a total weight of the solution, at least about 4% by weight of the corrosion inhibitor for a total weight of the solution, or at least about 9% by weight of the corrosion inhibitor for a total weight of the solution. The concentrated version of the solution can also include an amount of the corrosion inhibitor included in a range of about 0.2% by weight to about 25% by weight for a total weight of the solution. Furthermore, the concentrated version of the solution can include an amount of the corrosion inhibitor included in a range of about 2% by weight to about 8% by weight for a total weight of the solution.

The solution can include an anti-foaming agent. The anti-foaming agent can include a silicone-containing anti-foaming agent. For example, the anti-foaming agent can include BYK®-0093, BYK®-024, or BYK®-1785 from BYK-Chemie-GmbH of Wesel, Germany. The anti-foaming agent can also include an ethylene oxide/propylene oxide block co-polymer. To illustrate, the anti-foaming agent can include Pluronic® L61 from BASF SE of Ludwigshaten, Germany.

The solution can include no greater than about 5% by weight of the anti-foaming agent for a total weight of the solution, no greater than about 4% by weight of the anti-foaming agent for a total weight of the solution, or no greater than about 3% by weight of the anti-foaming agent for a total weight of the solution. The solution can also include at least about 0.01% by weight of the anti-foaming agent for a total weight of the solution, at least about 0.5% by weight of the anti-foaming agent for a total weight of the solution, or at least about 1% by weight of the anti-foaming agent for a total weight of the solution. Additionally, the solution can include an amount of the anti-foaming agent included in a range of about 0.01% by weight to about 2.5% by weight for a total weight of the solution. Further, the solution can include an amount of the anti-foaming agent included in a range of about 0.05% by weight to about 0.5% by weight for a total weight of the solution.

When the solution is a concentrated version of the solution that does not include additional water and/or hydrogen peroxide, the solution can include no greater than about 14% by weight of the anti-foaming agent for a total weight of the solution, no greater than about 10% by weight of the anti-foaming agent for a total weight of the solution, no greater than about 8% by weight of the anti-foaming agent for a total weight of the solution, or no greater than about 6% by weight of the anti-foaming agent for a total weight of the solution. In addition, the concentrated version of the solution can include at least about 0.02% by weight of the anti-foaming agent for a total weight of the solution, at least about 0.5% by weight of the anti-foaming agent for a total weight of the solution, at least about 1% by weight of the anti-foaming agent for a total weight of the solution, or at least about 3% by weight of the anti-foaming agent for a total weight of the solution. The concentrated version of the solution can also include an amount of the anti-foaming agent included in a range of about 0.02% by weight to about 12% by weight for a total weight of the solution. Furthermore, the concentrated version of the solution can include an amount of the anti-foaming agent included in a range of about 0.06% by weight to about 3% by weight for a total weight of the solution.

The solution can include an amount of hydrogen peroxide that is no greater than about 8% by weight for a total weight of the solution, no greater than about 6% by weight for a total weight of the solution, or no greater than about 4% by weight for a total weight of the solution. The solution can also include at least about 0.5% by weight hydrogen peroxide for a total weight of the solution, at least about 1% by weight hydrogen peroxide for a total weight of the solution, or at least about 3% by weight hydrogen peroxide for a total weight of the solution. In addition, the solution can include an amount of hydrogen peroxide included in a range of about 1% by weight to about 6% by weight for a total weight of the solution. Further, the solution can include an amount of hydrogen peroxide included in a range of about 3% by weight to about 5% by weight for a total weight of the solution.

Where the solution is a concentrated version of the solution that does not include additional water or hydrogen peroxide additional, water may be added at point of use. Thus, additional water can be added to the solution. The solution can also be operated free from additional water. When the solution is free of added water, the water can be provided from blended solutions such as an aqueous solution that includes the quaternary ammonium hydroxide. Additionally, the water can be provided when the quaternary ammonium hydroxide is a crystalline solid that forms a hydrate with water.

An amount of water included in the solution can be no greater than about 98% by weight for a total weight of the solution, no greater than about 90% by weight for a total weight of the solution, or no greater than about 80% by weight for a total weight of the solution. The solution can also include at least about 50% by weight water for a total weight of the solution, at least about 60% by weight water for a total weight of the solution, at least about 70% by weight water for a total weight of the solution, or at least about 75% by weight water for a total weight of the solution. Additionally, the solution can include an amount of water included in a range of about 62% by weight to about 98% by weight for a total weight of the solution. Further, the solution can include an amount of water included in a range of about 81% by weight to about 92% by weight for a total weight of the solution.

When the solution includes a concentrated solution without additional water and/or hydrogen peroxide, the solution can include no greater than about 90% by weight water for a total weight of the solution, no greater than about 80% by weight water for a total weight of the solution, or no greater than about 70% by weight water for a total weight of the solution. Additionally, the concentrated version of the solution can include at least about 40% by weight water for a total weight of the solution, at least about 50% by weight water for a total weight of the solution, or at least about 60% by weight water for a total weight of the solution. A concentrated version of the solution can also include an amount of water included in a range of about 40% by weight to about 90% by weight for a total weight of the solution. Further, a concentrated version of the solution can include an amount of water included in a range of about 80% by weight to about 88% by weight for a total weight of the solution.

Providing a solution that includes a quaternary ammonium hydroxide, no greater than about 15% by weight hydrogen peroxide, and water can include adding a first solution to a second solution. In a particular example, the first solution can be free of hydrogen peroxide, while the second solution includes an amount of hydrogen peroxide included in a range of about 15% by weight to about 45% by weight for a total weight of the second solution. To illustrate, the second solution can include about 30% by weight hydrogen peroxide for a total weight of the second solution. Additionally, the first solution can include one or more of the concentrated solutions described herein. The first solution can also include an amount of quaternary ammonium hydroxide included in a range of about 0.5% by weight to about 12% by weight for a total weight of the first solution. In addition, the first solution can include an amount of an amine included in a range of about 1% by weight to about 12% by weight for a total weight of the first solution and an amount of a co-solvent included in a range of about 1% by weight to about 6% by weight for a total weight of the first solution. Further, the first solution can include an amount of corrosion inhibitor included in a range of about 0.1% by weight to about 6% by weight for a total weight of the first solution and/or an amount of anti-foaming agent included in a range of about 0.01% by weight to about 2.5% by weight for a total weight of the first solution.

A concentrated version of the solution can be provided that is free of hydrogen peroxide and additional water. The concentrated version of the solution can be mixed with water and hydrogen peroxide at the point of use. In an example, the concentrated version of the solution can include an amount of quaternary ammonium hydroxide included in a range of about 10% by weight to about 29% by weight for a total weight of the concentrated solution and an amount of an amine included in a range of about 6% by weight to about 41% by weight for a total weight of the concentrated solution. Additionally, the concentrated version of the solution can include an amount of co-solvent included in a range of about 6% by weight to about 27% by weight for a total weight of the concentrated solution, an amount of corrosion inhibitor included in a range of about 0.6% by weight to about 23% by weight for a total weight of the concentrated solution, and an amount of anti-foaming additive included in a range of about 0.06% by weight to about 11% by weight for a total weight of the concentrated solution. Further, a remainder of the concentrated version of the solution can include an amount of water. The water can be provided due to the quaternary ammonium hydroxide being a hydrate with water or the quaternary ammonium hydroxide being in an aqueous solution. In a particular example, the amine can include 1,8-Diazabicyclo [5.4.0]undec-7-ene and the co-solvent can include 2-pentanone.

Furthermore, a concentrated version of the solution can be free of hydrogen peroxide and have a particular amount of added water, but the particular amount of added water is less than a final amount of water for the solution. Thus hydrogen peroxide and an additional amount of water can be added to the concentrated version of the solution at the point of use. When hydrogen peroxide and water are added to a concentrated version of the solution, the concentrated version of the solution can include an amount of quaternary ammonium hydroxide included in a range of about 1% by weight to about 13% by weight for a total weight of the concentrated solution and an amount of an amine included in a range of about 1% by weight to about 15% by weight for a total weight of the concentrated solution. Additionally, the concentrated version of the solution can include an amount of co-solvent included in a range of about 1% by weight to about 8% by weight for a total weight of the concentrated solution, an amount of corrosion inhibitor included in a range of about 0.2% by weight to about 8% by weight for a total weight of the concentrated solution, and an amount of anti-foaming additive included in a range of about 0.02% by weight to about 3% by weight for a total weight of the concentrated solution. Further, a remainder of the concentrated version of the solution can include an amount of water. In a particular example, the amine can include 1,8-Diazabicyclo[5.4.0]undec-7-ene and the co-solvent can include 2-pentanone.

At 106, the process 100 includes contacting the substrate with a solution such that one or more sides of the substrate are contacted by the solution. The substrate can be contacted with the solution to remove at least a portion of one or more substances from the substrate. The solution can dissolve a targeted substance (e.g., photoresist) that is disposed on the substrate and/or cause the targeted substance to be released from the substrate. In particular, the solution can remove at least about 75% of the targeted substance from the substrate, at least about 85% of the targeted substance from the substrate, at least about 95% of the targeted substance from the substrate, or at least about 99% of the targeted substance from the substrate. Additionally, the solution can remove substantially all of the substance from the substrate. The solution can include a formulation described previously herein.

The substrate can be immersed in the solution. For example, the substrate can be immersed in a bath of the solution. Alternatively, the solution can be applied to one or more sides of the substrate. To illustrate, the solution can be dispensed onto one or more sides of the substrate. The solution can also be coated onto one or more sides of the substrate. The solution can be agitated while the substrate is contacted with the solution.

Contacting the substance on the substrate with the solution can also include heating the solution, the substrate, or both to a temperature that provides for the removal of the substance within a specified period of time. The solution, the substrate, or both can be heated to a temperature no greater than about 99° C., no greater than about 75° C., or no greater than about 60° C. Additionally, the substrate, or both can be heated to a temperature of at least about 15° C., at least about 30° C., or at least about 45° C. Furthermore, the solution, the substrate, or both can be heated to a temperature included in a range of about 40° C. to about 80° C. The solution, the substrate, or both can also be heated to a temperature included in a range of about 50° C. to about 70° C.

An amount of heat to increase a temperature of the solution and/or substrate can be provided by a heat source, such as a conductive heat source or a convective heat source. The amount of heat provided by the heat source can be reduced in some cases due to the exothermic nature of the decomposition of hydrogen peroxide.

The substrate can be contacted with the solution for a specified duration that is no greater than about 180 minutes, no greater than about 150 minutes, no greater than about 120 minutes, or no greater than about 90 minutes. Additionally, the substrate can be contacted with the solution for a specified duration that is at least about 10 minutes, at least about 25 minutes, at least about 40 minutes, or at least about 60 minutes. Further, the substrate can be contacted with the solution for a duration included in a range of about 15 minutes to about 120 minutes. The substrate can also be contacted with the solution for a duration included in a range of about 45 minutes to about 70 minutes.

The substrate can be contacted with an initial amount of the solution, and then contacted with additional amounts of the solution at suitable time intervals. For example, the substrate can be contacted with a first volume of solution at a first time with a second volume of the solution being added to the first volume of the solution at a second time. Additionally, the second time can be at least about 5 minutes after the first time, at least about 10 minutes after the first time, at least about 15 minutes after the first time, or at least about 20 minutes after the first time. Further, the substrate can be contacted with an initial volume of the solution and a second volume of the solution can be added to the initial volume after about 15 minutes. A plurality of additional amounts of the solution can also be added to the initial volume of the solution at specified intervals, such as about every 5 minutes, about every 10 minutes, about every 15 minutes, about every 20 minutes, or about every 30 minutes. In addition, the time interval can be included in a range of 10 minutes to 20 minutes. The time intervals between the addition of solution to the initial volume of solution contacting the substrate can be based on maintaining a specified concentration of hydrogen peroxide in the solution contacting the substrate or based on maintaining a specified amount of hydrogen peroxide in the solution contacting the substrate.

Furthermore, multiple additions of a solution to a volume of solution contacting the substrate can be provided. For example, a first amount of a supplementary solution can be added to a first volume of solution contacting the substrate after a first time interval to produce a second volume of the solution contacting the substrate, and a second amount of the supplementary solution can be added to the second volume of the solution contacting the substrate to produce a third volume of the solution contacting the substrate. The composition of the first volume of the solution contacting the substrate, the composition of the second volume of the solution contacting the substrate, and the composition of the third volume of the solution contacting the substrate can be substantially the same. Alternatively, the composition of the first volume of the solution contacting the substrate, the composition of the second volume of the solution contacting the substrate, and the composition of the third volume of the solution contacting the substrate can be different.

Amounts of a solution can be added to a volume of the solution contacting the substrate in a substantially continuous manner. The rate of adding the solution to a volume of solution contacting the substrate can depend on an amount of the volume of the solution contacting the substrate. For example, a rate of adding solution to a volume of solution contacting the substrate can include about 0.1% of the volume of the solution contacting the substrate/minute to about 5% of the volume of the solution contacting the substrate/minute. In another example, a rate of adding solution to a volume of solution contacting the substrate can include about 0.5% of the volume of the solution contacting the substrate/minute to about 2% of the volume of the solution contacting the substrate/minute. In an illustrate example, when the volume of the substrate contacting the solution is 200,000 mL, the rate of adding a solution to the volume of solution contacting the substrate can be included in a range of about 200 mL/minute to 10,000 mL/minute. The rate of adding solution to a volume of solution contacting the substrate can be maintained for a suitable duration, such as at least about 5 minutes, at least about 10 minutes, at least about 15 minutes, or at least about 20 minutes. The rate of adding solution to a volume of solution contacting the substrate can also be maintained for a duration of no greater than about 90 minutes, no greater than about 75 minutes, no greater than about 60 minutes, or no greater than about 45 minutes.

The solution included in the volume of solution contacting the substrate can be a first solution and the solution added to the volume of solution contacting the substrate can be a second solution. The first solution can have a different composition from the second solution. For example, the first solution contacting the substrate can have a composition of concentrated versions of the solution described herein that are free of hydrogen peroxide, and the second solution can include an aqueous solution that includes an amount of hydrogen peroxide present in an amount of about 20% by weight to about 40% by weight for a total weight of the second solution. In another example, the composition of the first solution can include compositions of solutions described herein that include hydrogen peroxide, and the composition of the second solution can include an aqueous solution that includes an amount of hydrogen peroxide present in an amount of about 20% by weight to about 40% by weight for a total weight of the second solution. Further, the composition of the first solution can have substantially the same composition as the second solution.

The rate of addition to an initial volume of solution can be based, at least in part, on maintaining a threshold concentration of hydrogen peroxide in the solution. Further, the rate of addition to an initial volume of solution can be based, at least in part, on a total amount of hydrogen peroxide in the solution. The rate of addition to an initial volume of solution can also be based, at least in part, on varying the concentration of hydrogen peroxide in the solution over time. For example, a volume of solution can have a first concentration of hydrogen peroxide at a first time, and an additional solution can be added to the volume of solution at a rate to change the concentration of hydrogen peroxide to a second concentration. To illustrate, the second concentration of hydrogen peroxide can be less than the first concentration of hydrogen peroxide. In another illustration, the second concentration of hydrogen peroxide can be greater than the first concentration of hydrogen peroxide.

The composition of the solution can change over time and additional amounts of the solution added to a current amount of the solution can be added to maintain the amount of one or more components of the overall solution within a specified range. Furthermore, at some point, a current amount of the solution can be replaced with a fresh amount of the solution after a period of time. This process can be referred to as a bleed and feed operation. Additionally, a current amount of the solution can be replaced with a fresh amount of the solution when the current amount of the solution is unable to remove an amount of one or more substances from the substrate after the substrate has been contacted with the current amount of the solution for a specified period of time.

A concentrated version of the solution can be added to a container at atmospheric pressure. The version of the solution without peroxide can then be heated to a target temperature, such as a temperature included in a range of about 50° C. to about 70° C. Additionally, an amount of a hydrogen peroxide solution can be added to the version of the solution without peroxide to bring the composition to that of the compositions of the solutions described herein. The hydrogen peroxide solution can include an amount of hydrogen peroxide included in a range of about 25% by weight to about 35% by weight for a total weight of the hydrogen peroxide solution with the remainder being water. Further, the hydrogen peroxide solution can be added, in some instances, to the concentrated version of the solution after the concentrated version of the solution is heated to the target temperature. The substrate can then be contacted with the solution for removal of one or more substances from the substrate.

After being contacted with the solution for a period of time, the substrate can then be rinsed and dried. For example, the substrate can be subjected to one or more rinse operations using deionized water. Examples of typical rinsing agents include deionized water and/or low boiling point solvents such as acetone and isopropyl alcohol (IPA). The substrate can be rinsed using multiple operations, such as an IPA rinse followed by a deionized water rinse. Alternatively, the substrate can be rinsed in water followed by an IPA rinse. The substrate can be subjected to one or more drying operations, such as drying using a stream of one or more of air, nitrogen, or argon.

The substrate can be contacted with one solution to partially remove a substance from the substrate followed by contact with a hydrogen peroxide containing solution according to solutions described herein to further remove the substance from the substrate. Contacting the substrate with the first solution can remove no greater than about 75% of the substance from the substrate, no greater than about 60% of the substance from the substrate, or no greater than about 45% of the substance from the substrate. The first solution can include an amount of a polar aprotic solvent, such as 1-formylpiperidine, or an amount of a polar protic solvent included in a range of about 65% by weight to about 80% by weight for a total weight of the first solution, an amount of glycerin includes in a range of about 1% by weight to about 6% by weight for a total weight of the first solution, an amount of an amine, such as ethanolamine (MEA), included in a range of about 3% by weight to about 10% by weight for a total weight of the first solution, an amount of a quaternary ammonium hydroxide, such as tetramethylammonium hydroxide, included in a range of about 1% by weight to about 5% by weight for a total weight of the first solution, an amount of water included in a range of about 1% by weight to about 5% by weight for a total weight of the first solution, and/or an amount of tetrahydrofurfuryl alcohol (THFA) included in a range of about 7% by weight to about 15% by weight for a total weight of the solution. The first solution can be applied to the substrate at a temperature includes in a range of about 60° C. to about 80° C. for a duration included in a range of about 15 minutes to about 60 minutes. Further, the substrate can then be contacted with a hydrogen peroxide containing solution at a temperature included in a range of about 50° C. to about 70° C. for a duration included in a range of about 10 minutes to about 30 minutes.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

EXAMPLES

Examples 1-6

Compositions were used to remove a thick-acrylic-based dry film, patterned on a dielectric material and filled with a tin-based lead-free solder. Resist removal was completed after solder fill and reflow. Coupon-sized samples of the wafer were processed in beakers. Each coupon sample was processed in the following manner, using 4 beakers for each sample. First, beaker-1 was filled with a formulation and heated to the target processing temperature. When the formulation was at the target temperature, a mass of hydrogen peroxide solution (30 wt. % $H_2O_2$ in water) was added to beaker-1, and the coupon sample was placed in beaker-1.

After 15 min, hydrogen peroxide solution was added to beaker-2 that was filled with the same formulation as beaker-1 at the target processing temperature, and the coupon sample was transferred from beaker-1 to beaker-2. After 15 min, hydrogen peroxide solution was added to beaker-3 that was filled with the same formulation as beaker-2 at the target processing temperature, and the coupon sample was transferred from beaker-2 to beaker-3. After 15 min, hydrogen peroxide solution was added to beaker-4 that was filled with the same formulation as beaker-3 at the target processing temperature, and the coupon sample was transferred from beaker-3 to beaker-4. After 15 min, the sample was removed from beaker-4, rinsed with DI water and IPA, and dried with a stream of air. The total processing time for each sample is 60 min. The composition of each of the 4 beakers was substantially identical for each sample. Table 1 lists the formulations that were tested for Examples 1-6. Table 1 describes the formulation composition after the addition of hydrogen peroxide. Each of the four beakers contains substantially the same formulation for each respective example. Resist removal and Cu corrosion observations are also listed in Table 1.

TABLE 1

| Example | Quaternary Ammonium Hydroxide, (g) | $H_2O_2$ (g) | $H_2O$ (g) | Process Temp (° C.) | Total Process Time (min) | Resist Removal | Cu Corrosion |
|---|---|---|---|---|---|---|---|
| 1 | TMAH, 2.3 | 4.8 | 92.9 | 70 | 60 | clean | mild |
| 2 | TEAH, 3.7 | 4.8 | 91.5 | 70 | 60 | very little residue | mild |
| 3 | TPAH, 5.1 | 4.8 | 90.1 | 70 | 60 | mostly clean | mild |
| 4 | TEAH, 1.9 | 4.8 | 93.3 | 70 | 60 | clean | mild |
| 5 | TEAH, 5.6 | 4.8 | 89.6 | 70 | 60 | mostly clean | mild |
| 6 | TEAH, 7.4 | 4.8 | 87.8 | 70 | 60 | mostly clean | mild |

Formulations containing TMAH or TEAH result in complete resist removal. Increasing concentrations of TEAH result in worse resist removal.

Examples 7-14

Compositions were used to remove a thick-acrylic-based dry film, patterned on a dielectric material and filled with a tin-based lead-free solder. Resist removal was completed after solder fill and reflow. Coupon-sized samples of the wafer were processed in beakers. Each coupon sample was processed in the following manner, using one beaker for each sample. First, a beaker was filled with a formulation and heated to the target processing temperature. When the formulation was at the target temperature, a mass of hydrogen peroxide solution (30 wt. % $H_2O_2$ in water) was added to the beaker, and the coupon sample was placed in the beaker. After a period of time, additional hydrogen peroxide solution was added to the same beaker. Additional hydrogen peroxide solution may be added to the same beaker after varying increments of time.

Due to the addition of hydrogen peroxide to the same beaker throughout the process, the composition of the formulation in that beaker changed over the course of the cleaning process. Also, the hydrogen peroxide decomposed continually after it was added to the beaker. It was assumed that the hydrogen peroxide was completely decomposed before additional hydrogen peroxide was added to the beaker. Therefore, 47% of the previous mass of hydrogen peroxide was assumed to be converted to $O_2$ and lost to the environment, and 53% of the previous mass of hydrogen peroxide was converted to water. After each new addition of hydrogen peroxide the mass of hydrogen peroxide was assumed to be due only to the new addition.

Example 7

Table 2 lists the composition of the formulation used for Example 7. Hydrogen peroxide was added to the beaker three times, each after 15 min. The total process time was 60 min, and the process temperature was 70° C.

TABLE 2

| Time (min) | Total Weight (g) | TEAH (g) | % TEAH | $H_2O_2$ (g) | % $H_2O_2$ | $H_2O$ (g) | % $H_2O$ |
|---|---|---|---|---|---|---|---|
| 0 | 100 | 3.72 | 3.72 | 4.80 | 4.80 | 91.5 | 91.5 |
| 15 | 113.7 | 3.72 | 3.27 | 4.80 | 4.22 | 105.2 | 92.5 |

TABLE 2-continued

| Time (min) | Total Weight (g) | TEAH (g) | % TEAH | $H_2O_2$ (g) | % $H_2O_2$ | $H_2O$ (g) | % $H_2O$ |
|---|---|---|---|---|---|---|---|
| 30 | 127.5 | 3.72 | 2.92 | 4.80 | 3.77 | 119.0 | 93.3 |
| 45 | 141.2 | 3.72 | 2.63 | 4.80 | 3.40 | 132.7 | 94.0 |

Example 8

Table 3 lists the composition of the formulation used for Example 8. Hydrogen peroxide was added to the beaker three times, each after 15 min. The total process time was 60 min, and the process temperature was 80° C.

TABLE 3

| Time (min) | Total Weight (g) | TEAH (g) | % TEAH | $H_2O_2$ (g) | % $H_2O_2$ | $H_2O$ (g) | % $H_2O$ |
|---|---|---|---|---|---|---|---|
| 0 | 100 | 3.72 | 3.72 | 2.0 | 2.0 | 94.3 | 94.3 |
| 15 | 115.1 | 3.72 | 3.23 | 2.0 | 1.7 | 109.3 | 95.0 |
| 30 | 130.1 | 3.72 | 2.86 | 2.0 | 1.5 | 124.4 | 95.6 |
| 45 | 145.2 | 3.72 | 2.56 | 2.0 | 1.4 | 139.4 | 96.1 |

Example 9

Table 4 lists the composition of the formulation used for Example 9. Hydrogen peroxide was added to the beaker three times, each after 15 min. The total process time was 60 min, and the process temperature was 80° C.

TABLE 4

| Time (min) | Total Weight (g) | TEAH (g) | % TEAH | $H_2O_2$ (g) | % $H_2O_2$ | $H_2O$ (g) | % $H_2O$ |
|---|---|---|---|---|---|---|---|
| 0 | 100 | 3.72 | 3.72 | 4.80 | 4.80 | 91.5 | 91.5 |
| 15 | 113.7 | 3.72 | 3.27 | 4.80 | 4.22 | 105.2 | 92.5 |
| 30 | 127.5 | 3.72 | 2.92 | 4.80 | 3.77 | 119.0 | 93.3 |
| 45 | 141.2 | 3.72 | 2.63 | 4.80 | 3.40 | 132.7 | 94.0 |

Example 10

Table 5 lists the composition of the formulation used for Example 10. Hydrogen peroxide was added to the beaker three times, each after 15 min. The total process time was 60 min, and the process temperature was 80° C.

TABLE 5

| Time (min) | Total Weight (g) | TEAH (g) | % TEAH | $H_2O_2$ (g) | % $H_2O_2$ | $H_2O$ (g) | % $H_2O$ |
|---|---|---|---|---|---|---|---|
| 0 | 100 | 3.72 | 3.72 | 3.0 | 3.0 | 93.3 | 93.3 |
| 15 | 114.6 | 3.72 | 3.25 | 3.0 | 2.6 | 107.9 | 94.1 |
| 30 | 129.2 | 3.72 | 2.88 | 3.0 | 2.3 | 122.5 | 94.8 |
| 45 | 143.8 | 3.72 | 2.59 | 3.0 | 2.1 | 137.0 | 95.3 |

Table 6 summarizes the results for Examples 7-10.

| Example | TEAH, initial % | $H_2O_2$ addition | Process Temp (° C.) | Total Process Time (min) | Resist Removal | Cu Corrosion | Foam |
|---|---|---|---|---|---|---|---|
| 7 | 3.72 | 4 × 4.8 g | 70 | 60 | mostly clean | mild | heavy |
| 8 | 3.72 | 4 × 2 g | 80 | 60 | mostly clean | none | heavy |
| 9 | 3.72 | 4 × 4.8 g | 80 | 60 | clean | mild | heavy |
| 10 | 3.72 | 4 × 3 g | 80 | 60 | clean | mild | heavy |

Increasing the processing temperature from 70° C. to 80° C. improved the cleaning performance. Reducing the amount of hydrogen peroxide addition resulted in worse resist removal but better Cu corrosion (i.e., reduced Cu corrosion).

Example 11

Table 7 lists the composition of the formulation for Example 11. Hydrogen peroxide was added to the beaker three times, each after 15 min. The total process time was 60 min, and the process temperature was 80° C.

TABLE 7

| Time | Total Weight (g) | TEAH (g) | % TEAH | $H_2O_2$ (g) | % $H_2O_2$ | MPK (g) | % MPK | $H_2O$ (g) | % $H_2O$ |
|---|---|---|---|---|---|---|---|---|---|
| 0 | 100 | 3.72 | 3.72 | 4.8 | 4.8 | 3.0 | 3.0 | 88.5 | 88.5 |
| 15 | 113.7 | 3.72 | 3.27 | 4.8 | 4.2 | 3.0 | 2.6 | 102.2 | 89.9 |
| 30 | 127.5 | 3.72 | 2.92 | 4.8 | 3.8 | 3.0 | 2.4 | 116.0 | 91.0 |
| 45 | 141.2 | 3.72 | 2.63 | 4.8 | 3.4 | 3.0 | 2.1 | 129.7 | 91.8 |

Example 12

Table 8 lists the composition of the formulation for Example 12. Hydrogen peroxide was added to the beaker three times, each after 15 min. The total process time was 60 min, and the process temperature was 80° C.

TABLE 8

| Time (min) | Total Weight (g) | TEAH (g) | % TEAH | $H_2O_2$ (g) | % $H_2O_2$ | DBU (g) | % DBU | $H_2O$ (g) | % $H_2O$ |
|---|---|---|---|---|---|---|---|---|---|
| 0 | 100 | 3.72 | 3.72 | 4.8 | 4.8 | 5.0 | 5.0 | 86.5 | 86.5 |
| 15 | 113.7 | 3.72 | 3.27 | 4.8 | 4.2 | 5.0 | 4.4 | 100.2 | 88.1 |
| 30 | 127.5 | 3.72 | 2.92 | 4.8 | 3.8 | 5.0 | 3.9 | 114.0 | 89.4 |
| 45 | 141.2 | 3.72 | 2.63 | 4.8 | 3.4 | 5.0 | 3.5 | 127.7 | 90.4 |

Example 13

Table 9 lists the composition of the formulation for Example 13. Hydrogen peroxide was added to the beaker two times, each after 45 min. The total process time was 165 min, and the process temperature was 40° C.

TABLE 9

| Time | Total Weight (g) | TEAH (g) | % TEAH | $H_2O_2$ (g) | % $H_2O_2$ | MPK (g) | % MPK | $H_2O$ (g) | % $H_2O$ |
|---|---|---|---|---|---|---|---|---|---|
| 0 | 100 | 3.72 | 3.72 | 4.8 | 4.8 | 3.0 | 3.0 | 88.5 | 88.5 |
| 45 | 113.7 | 3.72 | 3.27 | 4.8 | 4.2 | 3.0 | 2.6 | 102.2 | 89.9 |
| 90 | 127.5 | 3.72 | 2.92 | 4.8 | 3.8 | 3.0 | 2.4 | 116.0 | 91.0 |

Example 14

Table 10 lists the composition of the formulation for Example 14. Hydrogen peroxide was added to the beaker three times, each after 15 min. The total process time was 60 min, and the process temperature was 60° C.

TABLE 10

| Time (min) | Total Weight (g) | TEAH (g) | % TEAH | $H_2O_2$ (g) | % $H_2O_2$ | DBU (g) | % DBU | $H_2O$ (g) | % $H_2O$ |
|---|---|---|---|---|---|---|---|---|---|
| 0 | 100 | 3.72 | 3.72 | 4.8 | 4.8 | 5.0 | 5.0 | 86.5 | 86.5 |
| 15 | 113.7 | 3.72 | 3.27 | 4.8 | 4.2 | 5.0 | 4.4 | 100.2 | 88.1 |
| 30 | 127.5 | 3.72 | 2.92 | 4.8 | 3.8 | 5.0 | 3.9 | 114.0 | 89.4 |
| 45 | 141.2 | 3.72 | 2.63 | 4.8 | 3.4 | 5.0 | 3.5 | 127.7 | 90.4 |

Table 11 summarizes the results for Examples 11-14.

| Example | TEAH, initial % | Co-solvent | $H_2O_2$ addition | Process Temp (° C.) | Total Process Time (min) | Resist Removal | Cu Corrosion | Foam |
|---|---|---|---|---|---|---|---|---|
| 11 | 3.72 | 3% MPK | 4 × 4.8 g | 80 | 60 | clean | mild | heavy |
| 12 | 3.72 | 5% DBU | 4 × 4.8 g | 80 | 60 | clean | significant | heavy |
| 13 | 3.72 | 3% MPK | 4 × 4.8 g | 40 | 165 | not clean | mild | heavy |
| 14 | 3.72 | 5% DBU | 4 × 4.8 g | 60 | 60 | mostly clean | mild | heavy |

The addition of MPK or DBU aided resist removal, however, DBU resulted in increased Cu corrosion. Reducing the temperature to 40° C. or 60° C. decreased the resist removal efficacy.

Examples 15-21

Table 12 lists compositions for Examples 15-21. In Table 12, the compositions are listed as the initial compositions as soon as the first addition of hydrogen peroxide solution (30 wt. % $H_2O_2$ in water) was added to the beaker. Table 12 also lists the number of additions of hydrogen peroxide, and the amount of each hydrogen peroxide addition. Aside from the initial composition, the additional water added to each beaker due to the addition of hydrogen peroxide solution after t=0 min was not accounted for in Table 12.

TABLE 12

Initial compositions for Examples 15-21.

| Example | Initial Composition | | | | | | | Total H$_2$O$_2$ addition |
|---|---|---|---|---|---|---|---|---|
| | TEAH (g) | H$_2$O$_2$ (g) | MPK (g) | DBU (g) | H$_2$O (g) | Defoamer | Corrosion Inhibitor | |
| 15 | 3.72 | 4.8 | 3.0 | 0.0 | 88.5 | 0.01 g Antifoam SE-15 | none | 4 × 4.8 g |
| 16 | 3.72 | 4.8 | 3.0 | 5.0 | 83.5 | 0.01 g Antifoam SE-15 | none | 4 × 4.8 g |
| 17 | 3.72 | 4.8 | 3.0 | 5.0 | 81.5 | 0.01 g Antifoam SE-15 | 1.6 g BTA/0.4 g TTA | 4 × 4.8 g |
| 18 | 3.72 | 4.8 | 3.0 | 2.5 | 86.0 | 0.01 g Antifoam SE-15 | none | 4 × 4.8 g |
| 19 | 3.72 | 4.8 | 3.0 | 5.0 | 83.0 | 0.01 g Antifoam SE-15 | 0.5 g Corfree M1 | 4 × 4.8 g |
| 20 | 3.72 | 4.8 | 3.0 | 10.0 | 78.5 | 0.01 g Antifoam SE-15 | none | 4 × 4.8 g |
| 21 | 1.86 | 4.8 | 3.0 | 5.0 | 85.3 | 0.01 g Antifoam SE-15 | none | 4 × 4.8 g |

Table 13 summarizes the results for Examples 15-21.

| Example | Process Temp (° C.) | Total Process Time (min) | Resist Removal | Cu Corrosion | Foam |
|---|---|---|---|---|---|
| 15 | 60 | 60 | mostly clean | mild | low |
| 16 | 60 | 60 | clean | significant | moderate |
| 17 | 60 | 60 | not clean | none | low |
| 18 | 60 | 60 | clean | mild | moderate |
| 19 | 60 | 60 | clean | none | heavy |
| 20 | 60 | 60 | clean | significant | moderate |
| 21 | 60 | 60 | mostly clean | mild | low |

The results from Examples 15-21 show that the best cleaning performance was achieved with the addition of both MPK and DBU, however, increasing DBU resulted in significant Cu corrosion. Reducing the amount of TEAH reduced the resist removal efficacy. The addition of a defoamer additive reduced foam formation, but not for every formulation. The addition of a Cu corrosion inhibitor reduced Cu corrosion, however the addition of BTA/TTA resulted in worse resist removal.

Examples 22-30

Table 14 lists compositions for Examples 22-30. In Table 14, the compositions are listed as the initial compositions as soon as the first addition of hydrogen peroxide solution (30 wt. % H$_2$O$_2$ in water) was added to the beaker. Table 14 also lists the number of additions of hydrogen peroxide, and the amount of each hydrogen peroxide addition. Aside from the initial composition, the additional water added to each beaker due to the addition of hydrogen peroxide solution after t=0 min was not accounted for in Table 14. Note that for Example 23, the addition volume of hydrogen peroxide was less, and the total solution mass did not total 100 g.

TABLE 14

Initial compositions for Examples 22-30.

| Example | Initial Composition | | | | | | | Total H$_2$O$_2$ addition |
|---|---|---|---|---|---|---|---|---|
| | TEAH (g) | H$_2$O$_2$ (g) | MPK (g) | DBU (g) | H$_2$O (g) | Defoamer | Corrosion Inhibitor | |
| 22 | 3.72 | 4.8 | 3.0 | 2.5 | 85.9 | 0.05 g Antifoam SE-15 | none | 4 × 4.8 g |
| 23 | 3.72 | 2.4 | 3.0 | 10.0 | 72.3 | 0.05 g Antifoam SE-15 | 0.5 g Corfree M1 | 4 × 2.4 g |
| 24 | 3.72 | 4.8 | 3.0 | 2.5 | 85.4 | 0.05 g Antifoam SE-15 | 0.5 g Corfree M1 | 4 × 4.8 g |
| 25 | 3.72 | 4.8 | 3.0 | 2.5 | 85.0 | 0.5 g Antifoam SE-15 | 0.5 g Corfree M1 | 4 × 4.8 g |
| 26 | 3.72 | 4.8 | 3.0 | 2.5 | 85.0 | 0.5 g BYK-024 | 0.5 g Corfree M1 | 4 × 4.8 g |

TABLE 14-continued

Initial compositions for Examples 22-30

| | | | Initial Composition | | | | | |
|---|---|---|---|---|---|---|---|---|
| Example | TEAH (g) | $H_2O_2$ (g) | MPK (g) | DBU (g) | $H_2O$ (g) | Defoamer | Corrosion Inhibitor | Total $H_2O_2$ addition |
| 27 | 3.72 | 4.8 | 3.0 | 2.5 | 85.0 | 0.5 g BYK-025 | 0.5 g Corfree M1 | 4 × 4.8 g |
| 28 | 3.72 | 4.8 | 3.0 | 2.5 | 85.0 | 0.5 g BYK-093 | 0.5 g Corfree M1 | 4 × 4.8 g |
| 29 | 3.72 | 4.8 | 3.0 | 2.5 | 85.0 | 0.5 g BYK-1785 | 0.5 g Corfree M1 | 4 × 4.8 g |
| 30 | 3.72 | 4.8 | 3.0 | 2.5 | 85.0 | 0.5 g Pluronic L61 | 0.5 g Corfree M1 | 4 × 4.8 g |

Table 15 summarizes the results for Examples 22-30.

| Example | Process Temp (° C.) | Total Process Time (min) | Resist Removal | Cu Corrosion | Foam |
|---|---|---|---|---|---|
| 22 | 60 | 60 | clean | mild | moderate |
| 23 | 60 | 60 | mostly clean | none | low |
| 24 | 60 | 60 | clean | none | moderate |
| 25 | 60 | 60 | clean | none | moderate |
| 26 | 60 | 60 | clean | none | none |
| 27 | 60 | 60 | mostly clean | none | low |
| 28 | 60 | 60 | clean | none | low |
| 29 | 60 | 60 | clean | none | none |
| 30 | 60 | 60 | clean | none | none |

The result from Example 23 shows that reducing the amount of hydrogen peroxide reduced the resist removal efficacy, even with a higher concentration of DBU. The results from Examples 23-30 show that the addition of 0.5 g of Corfree M1 resulted in no observable or very limited Cu corrosion. The results from Examples 26-30 show that the addition of 0.5 g of a defoamer additive eliminated or greatly reduced foam generation.

Examples 31-32

Compositions were used to remove a thick-acrylic-based dry film, patterned on a dielectric material and filled with a tin-based lead-free solder. Resist removal was completed after solder fill and reflow. Coupon-sized samples of the wafer were processed in beakers. Each coupon sample was processed in the following manner, using 1 beaker for each sample. First, a beaker was filled with a formulation and heated to the target processing temperature. When the formulation was at the target temperature, a constant addition of hydrogen peroxide solution (30 wt. % $H_2O_2$ in water) was added to the beaker, and the coupon sample was placed in the beaker. Table 16 lists compositions for Examples 31-32. In Table 16, the compositions were listed as the initial compositions before the addition of hydrogen peroxide solution.

TABLE 16

Initial compositions for Examples 31-32.

| | | | | Initial Composition | | | |
|---|---|---|---|---|---|---|---|
| Example | TEAH (g) | MPK (g) | DBU (g) | $H_2O$ (g) | Defoamer | Corrosion Inhibitor | 30% $H_2O_2$ addition |
| 31 | 3.72 | 3.0 | 2.5 | 73.8 | 0.5 g BYK-024 | 0.5 g Corfree M1 | 1 mL/min |
| 32 | 3.72 | 3.0 | 2.5 | 73.8 | 0.5 g BYK-024 | 0.5 g Corfree M1 | 0.5 mL/min |

Table 17 summarizes the results for Examples 31-32.

| Example | Process Temp (° C.) | Total Process Time (min) | Resist Removal | Cu Corrosion | Foam |
|---|---|---|---|---|---|
| 31 | 60 | 60 | clean | none | none |
| 32 | 60 | 60 | mostly clean | none | none |

In Example 31, the total amount of hydrogen peroxide added to the beaker was 18 g, and the total amount of hydrogen peroxide was 9 g in Example 32. These examples demonstrate that a total amount of hydrogen peroxide was required to achieve complete resist removal.

Examples 33-35

Table 18 lists compositions for Examples 33-35. Compositions were used to remove a thick-acrylic-based dry film, patterned on a dielectric material and filled with a tin-based lead-free solder. Resist removal was completed after solder fill and reflow. In Table 18, the compositions are listed as the initial compositions as soon as the first addition of hydrogen peroxide solution (30 wt. % $H_2O_2$ in water) was added to the beaker. Table 18 also lists the number of additions of hydrogen peroxide, and the amount of each hydrogen peroxide addition. Aside from the initial composition, the additional water added to each beaker due to the addition of hydrogen peroxide solution after t=0 min was not accounted for in Table 18.

TABLE 18

Initial compositions for Examples 33-35.

| Example | Initial Composition | | | | | | | $H_2O_2$ addition |
|---|---|---|---|---|---|---|---|---|
| | TEAH (g) | Solvent (g) | Amine (g) | $H_2O_2$ (g) | $H_2O$ (g) | Defoamer | Corrosion Inhibitor | |
| 33 | 3.72 | 2.51 g MEK | 2.5 g DBU | 4.8 | 85.47 | 0.5 g BYK-024 | 0.5 g Corfree M1 | 4 × 4.8 g |
| 34 | 3.72 | 3 g MPK | 1.3 g pyridine | 4.8 | 88.58 | 0.5 g BYK-024 | 0.5 g Corfree M1 | 4 × 4.8 g |
| 35 | 3.72 | 3.45 g NMP | 2.5 g DBU | 4.8 | 84.53 | 0.5 g BYK-024 | 0.5 g Corfree M1 | 4 × 4.8 g |

Table 19 summarizes the results for Examples 33-35.

| Example | Process Temp (° C.) | Total Process Time (min) | Resist Removal | Cu Corrosion | Foam |
|---|---|---|---|---|---|
| 33 | 60 | 60 | clean | significant | none |
| 34 | 60 | 60 | mostly clean | none | none |
| 35 | 60 | 60 | clean | none | none |

In Example 33, the use of MEK in place of MPK resulted in complete resist removal but with Cu corrosion. In Example 34, the use of pyridine in place of DBU resulted in almost complete resist removal with good Cu compatibility. In Example 35, the use of NMP in place of MPK resulted in complete resist removal with good Cu compatibility.

Example 36

The inventive composition also can be used in a multiple step process using multiple formulations. A first process step was performed to remove partially the photoresist. In the second process step, the inventive composition was used to finish the complete removal of the photoresist. In this 2-step process, the inventive composition was used where the addition of hydrogen peroxide was not needed; the hydrogen peroxide was added only at the beginning of the second process step. For Example 36, acrylic-based dry film photoresist was completely removed using a 2-step process as described in Table 20.

TABLE 20

Compositions for 2-step process for Example 36.

| Step | Composition | Process Temperature (° C.) | Process Time (min) | Resist Removal |
|---|---|---|---|---|
| 1 | 76.2 wt. % 1-formylpiperidine, 3 wt. % glycerin, 6 wt. % MEA, 2.4 wt. % TMAH, 2.4 wt. % $H_2O$, 10 wt. % THFA | 70 | 30 | Partial |
| 2 | 3.72 wt. % TEAH, 4.8 wt. % $H_2O_2$, 3 wt. % MPK, 2.5 wt. % DBU, 0.5 wt. % Corfree M1, 0.15 wt. % BYK-024, 85.33 wt. % $H_2O$ | 60 | 15 | Complete |

What is claimed is:

1. A solution comprising:
  a quaternary ammonium hydroxide present in an amount from about 2% by weight to about 5% by weight of a total weight of the solution;
  hydrogen peroxide present in an amount of at least about 3% by weight to no greater than about 8% by weight of the total weight of the solution;
  water;
  an amine present in an amount from about 2% by weight to about 6% by weight of the total weight of the solution; and
  a co-solvent present in an amount from about 1% by weight to about 10% by weight of the total weight of the solution.

2. The solution of claim 1, wherein an amount of water is included in a range of about 81% by weight to about 92% by weight of the total weight of the solution.

3. The solution of claim 1, wherein the quaternary ammonium hydroxide includes tetraethylammonium hydroxide.

4. The solution of claim 1, wherein an amount of water is at least about 50% by weight of the total weight of the solution.

5. The solution of claim 1, wherein the amine is a heterocyclic tertiary amine.

6. The solution of claim 1, wherein the amine includes 1,8-diazabicyclo[5.4.0]undec-7-ene, pyridine, 1,5-diazabicyclo[4.3.0]non-5-ene, 1,4-diazbicyclo[2.2.2]octane, hexamethylenetetramine, pyridazine, pyrimidine, phthalazine, pyrazine, quinolone, or a combination thereof.

7. The solution of claim 1, wherein the amine includes a tertiary amine.

8. The solution of claim 1, wherein an amount of the co-solvent is included in a range of about 2% by weight to about 4% by weight for the total weight of the solution.

9. The solution of claim 1, wherein the co-solvent includes n-methyl-2-pyrrolidone (NMP).

10. The solution of claim 1, wherein the co-solvent includes dimethyl sulfoxide (DMSO).

11. The solution of claim 1, wherein the co-solvent includes an organic polar solvent.

12. The solution of claim 1, wherein the co-solvent includes a ketone.

13. The solution of claim 12, wherein the co-solvent includes 2-pentanone or methyl ethyl ketone.

14. The solution of claim 1, further comprising an antifoaming agent present in an amount included in a range of about 0.01% by weight to about 2.5% by weight for the total weight of the solution.

15. The solution of claim 1, further comprising a corrosion inhibitor present in an amount included in a range of about 0.1% by weight to about 8% by weight of the total weight of the solution.

16. A solution comprising:
hydrogen peroxide;
a quaternary ammonium hydroxide present in an amount of at least about 2% by weight to no greater than about 9% by weight of a total weight of the solution;
a co-solvent including a ketone or n-methyl-2-pyrrolidone (NMP);
a tertiary amine present in an amount of at least about 0.8% to no greater than about 8% by weight of the total weight of the solution; and
water.

17. The solution of claim 16, wherein the hydrogen peroxide is present in an amount no greater than 15% by weight for the total weight of the solution.

18. The solution of claim 16, further comprising an antifoaming agent present in an amount included in a range of about 0.02% by weight to about 12% by weight for the total weight of the solution.

19. The solution of claim 16, wherein the tertiary amine is present in an amount included in a range of about 2% by weight to about 6% by weight for the total weight of the solution.

20. The solution of claim 16, wherein the amount of the quaternary ammonium hydroxide is included in a range of about 2% by weight to about 5% by weight of the total weight of the solution.

21. The solution of claim 16, wherein an amount of the co-solvent is included in a range of about 1% by weight to about 28% by weight of the total weight of the solution.

22. The solution of claim 16, further comprising a corrosion inhibitor present in an amount included in a range of about 0.2% by weight to about 25% by weight for the total weight of the solution.

23. The solution of claim 1, comprising adding to said solution a second solution comprising hydrogen peroxide and water at a hydrogen peroxide concentration of 15% by weight to about 45% by weight based on the weight of the second solution, to maintain the concentration of hydrogen peroxide in any amount that is no greater than 15 wt. % based on the weight of the solution.

24. The solution of claim 23, wherein the amount of hydrogen peroxide in the solution is at least 1 wt. %, based on the weight of the solution.

25. The solution of claim 1, wherein the amount of hydrogen peroxide in the solution is at least 3 wt. %, based on the weight of the solution.

26. The solution of claim 1, wherein the quaternary ammonium hydroxide is tetramethylammonium hydroxide.

27. The solution of claim 1, wherein the amount of hydrogen peroxide in the solution is at least 3 wt. %, based on the weight of the solution.

28. The solution of claim 1, wherein said solution does not contain a ketone.

* * * * *